United States Patent [19]

Howe

[11] Patent Number: 5,113,317

[45] Date of Patent: May 12, 1992

[54] SUPPORT FOR AUXILIARY CIRCUIT CARD

[75] Inventor: Joseph A. Howe, Ann Arbor, Mich.

[73] Assignee: Allen-Bradley Company, Inc., Milwaukee, Wis.

[21] Appl. No.: 481,581

[22] Filed: Feb. 20, 1990

[51] Int. Cl.[5] .............................................. H01R 23/68
[52] U.S. Cl. .................................. 361/413; 361/417; 361/399; 439/74
[58] Field of Search ............... 361/417, 412, 413, 415, 361/391, 395, 399; 439/74, 62, 64, 61; 29/762, 764, 278; 403/16, 321, 322; 360/99.02, 99.06; 211/41

[56] References Cited

U.S. PATENT DOCUMENTS

| | | |
|---|---|---|
| 3,197,731 | 7/1965 | Beale et al. |
| 3,457,621 | 7/1969 | Ebright et al. |
| 3,484,129 | 1/1968 | Askren |
| 3,626,575 | 12/1971 | Greenspan |
| 3,759,559 | 9/1973 | Yuska ................................ 29/278 X |
| 3,867,753 | 2/1975 | Urban, II et al. |
| 4,109,379 | 8/1978 | Ratti et al. |
| 4,200,900 | 4/1980 | McGeorge ................. 174/138 D X |
| 4,686,607 | 8/1987 | Johnson ............................ 361/413 |
| 4,758,928 | 7/1988 | Wierec et al. .................. 361/399 X |
| 4,840,570 | 6/1989 | Mann, Jr. et al. .............. 361/413 X |

OTHER PUBLICATIONS

Scanbe Electronic Packaging Hardware, pp. 478–479, Marsh Electronics, Inc., 1982–1983 Catalog.
Thermalloy, Inc. PC Board Hardware, p. 106, Marsh Electronics, Inc., 1982–1983 Catalog.

*Primary Examiner*—Leo P. Picard
*Assistant Examiner*—Paramita Ghosh
*Attorney, Agent, or Firm*—Quarles & Brady

[57] ABSTRACT

A three part card guide for attachment to a host circuit card has opposing guide rails to receive transverse edges of an auxiliary circuit card. The guide rails attach to either end of a connector support which holds a first electrical connector and an auxiliary circuit card may be slid between the guide rails so that a second electrical connector along its rearward edge engages the first electrical connector. The guide rails and connector support assembly have hooks, to attach them to the host circuit card, which may be engaged with longitudinal motion of the assembly. The electrical connector, when attached to the host card through the connector support, prevents such longitudinal motion, locking the assembly in place.

6 Claims, 3 Drawing Sheets

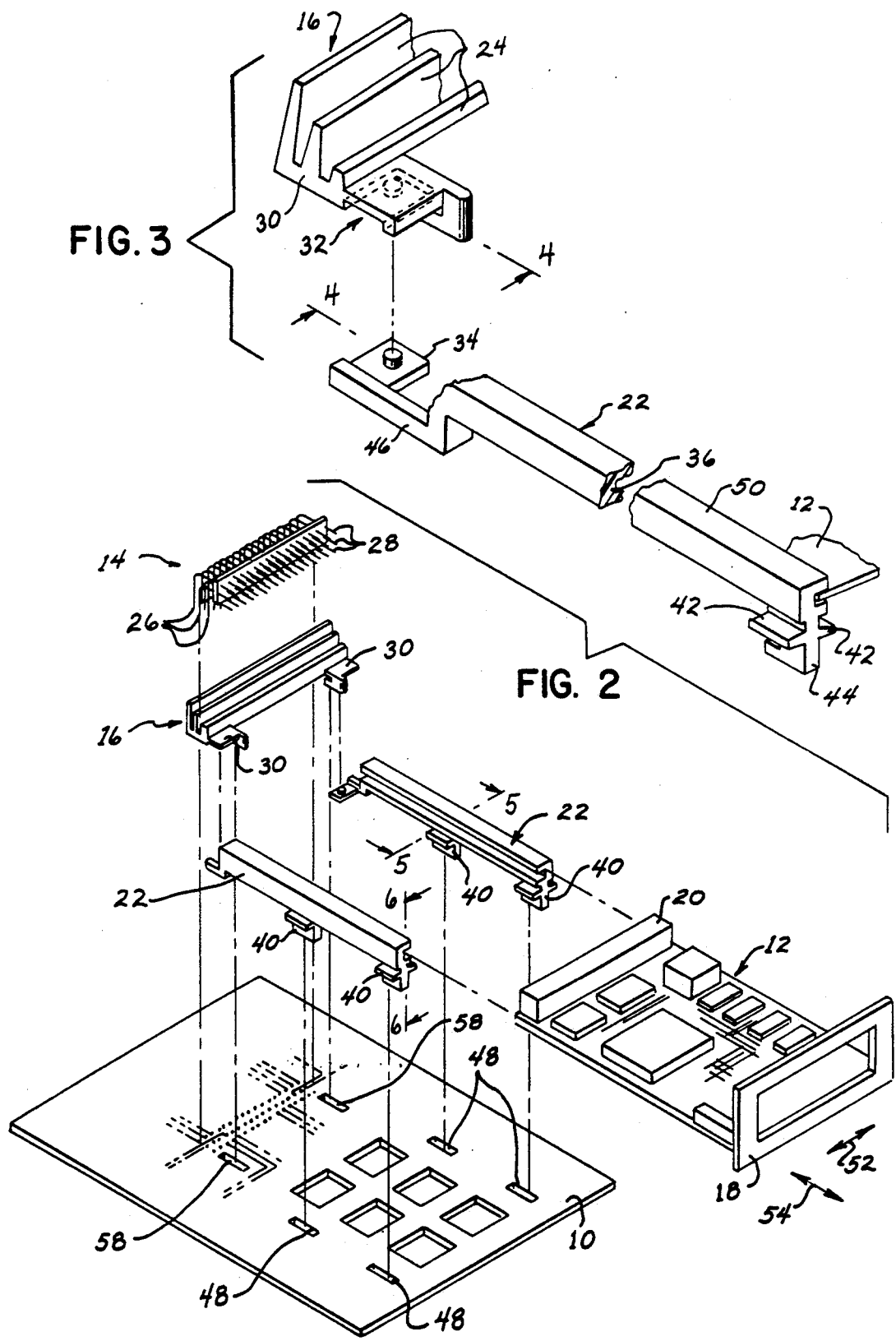

SUPPORT FOR AUXILIARY CIRCUIT CARD

BACKGROUND OF THE INVENTION

1. Field of the Invention

The field of the invention is circuit card supports and in particular, a circuit card support for removably holding an auxiliary circuit card parallel to a host circuit card.

2. Background Art

With large or complex electronic circuits it is frequently desirable to divide the circuit into several electrically interconnected subcircuits each contained on a separate circuit card.

The use of multiple, separate circuit cards provides several advantages. Individual cards may be replaced, reducing repair costs or allowing customized or expanded operation through the connection of optional circuit cards. Circuit functions may be separated, permitting ready isolation of faults. And, the use of multiple circuit cards may allow efficient packaging and improved mechanical resilience of the final product.

One method of connecting multiple circuit cards is through the use of a "mother" board having a plurality of "edge card" connectors on it surface. These connectors on the mother board receive mating connectors positioned along one edge of each of a number of "daughter" boards. The daughter boards fit perpendicularly against the mother board and are generally parallel to save space. An individual daughter board may be removed or replaced by sliding it out from between its neighboring daughter boards, away from the mother board.

The mechanical stability of this system may be increased by supporting the edges of the daughter boards in a card cage. The cage may have a plurality of guide rails for receiving the edges of the daughter cards as they are inserted or removed from the mother board and thereby reducing potentially damaging torque on the edge connectors. A card cage design is described in U.S. Pat. No. 4,716,495 entitled "Printed Circuit Board Chassis with Power Interlock", 4,716,495, assigned to the same assignee as the present invention.

The use of a card cage is most practical in situations where there are several daughter boards and the daughter boards have similar length and width. If a single auxiliary circuit card is to be connected to a host circuit card of different dimensions, other methods are usually adopted, such as the use of columnar standoffs attached to receiving holes in each circuit card to hold the cards separated but parallel to each other. Removal of a card attached by means of such standoffs is relatively difficult and usually requires that the auxiliary card be accessible in a direction normal to its surface. Each standoff must be unscrewed or unsnapped from its respective receiving hole. The subcircuits of multiple circuit cards may be electrically interconnected by connectors attached to a flexible cable or harness. The use of a flexible harness is required if the insertion axis of the connector to the auxiliary card is different from the insertion axis of the auxiliary card to the host card.

SUMMARY OF THE INVENTION

In accordance with the invention, an auxiliary circuit card is supported by guides extending parallel to each other along opposing edges of the auxiliary circuit card. The guides are attached to the face of a host circuit card and permit the auxiliary card to slide along the length of the guide into mating contact with an electrical connector attached to the host card. The connector is supported by a connector support, also attached to the face of the host card, which interlocks with the ends of the guides to position the guides with respect to the connector support and hence the connector.

It is an object of the invention to provide a simple means of mechanically and electrically connecting two circuit cards together that allows ready removal and replacement of the auxiliary circuit card. The guides permit the auxiliary card to be removed from the connector by sliding the circuit card longitudinally along its plane and parallel to the plane of the host circuit card. Accordingly, the area of access to the auxiliary card necessary for its removal may be relatively small.

It is another object of the invention to provide a simple means of mechanically and electrically connecting two circuit cards of different sizes together. The guide and connector support attach directly to the face of the larger host circuit card and hence the auxiliary circuit card and the host circuit card need not be the same size as is required in card cage designs.

It is another object of the invention to produce an auxiliary card support system that may be easily but securely attached to a host circuit card without the need for separate fasteners. The guide rails and connector support have integral hooks for engaging the slots cut within the host circuit card. The hooks are engaged by sliding the guide rails and connector supports with respect to the host circuit card. The hooks on the connector support are prevented from disengaging by the restraining action of the connector's attachment to the host card. The hooks on the guide rails are prevented from disengaging by the connector support which interlocks with the guide rails to prevent them from moving.

It is yet another object of the invention to provide an easily manufactured card support system that may accommodate a wide variety of different card sizes with a limited number of card guide components. The three part construction of the card support, including interlocking connector supports and guide rails, permits the manufacture of various length of guide rails and connector supports that may be matched in different combinations to permit their use with cards of varying dimension. The three part construction also allows the components to be readily manufactured of injection molded plastic.

Other objects and advantages besides those discussed above shall be apparent to those experienced in the art from the description of a preferred embodiment of the invention which follows. In the description, reference is made to the accompanying drawings, which form a part hereof, and which illustrate one example of the invention. Such example, however, is not exhaustive of the various alternative forms of the invention, and therefore reference is made to the claims which follow the description for determining the scope of the invention.

BRIEF DESCRIPTION OF THE DRAWINGS

FIG. 2 is an exploded view of the assembly of the auxiliary card, the host card and the card guide of FIG. 1;

FIG. 3 is an enlarged portion of FIG. 2 showing the interconnection of the connector support and the guide rails of the card guide of FIG. 1;

DETAILED DESCRIPTION OF THE PREFERRED EMBODIMENT

Figure 1:
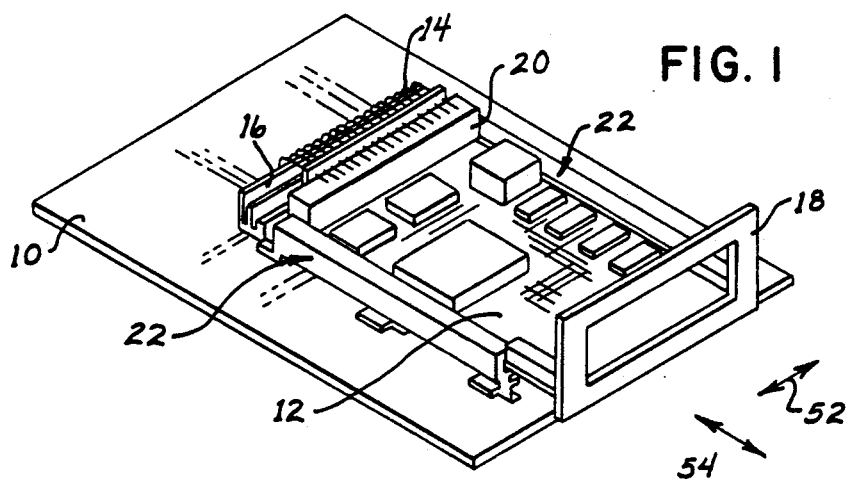
FIG. 1 is a perspective view of the auxiliary card attached to a host card by means of the card support of the present invention.

Referring to FIGS. 1 and 2, an auxiliary printed circuit card 12 is held generally parallel to a host circuit card 10 by guide rails 22. The guide rails 22 engage opposing edges of the auxiliary circuit card 12 in the transverse direction 52. The auxiliary circuit card 12 is thus free to slide in the longitudinal direction 54 along the guide rails 22.

At the rear edge of the auxiliary circuit card 12 is a connector socket 20 which receives corresponding pins of right angle connector 14 when the auxiliary card 12 is moved to its rearmost position along the guide rails 22. The right angle connector 14 is electrically connected to the host card 10 to allow electrical communication between the host card 10 and the auxiliary card 12 when connector socket 20 is engaged with right angle connector 14.

Attached to the front edge of the auxiliary card 12 is a faceplate 18 which serves to provide a means of grasping and removing the auxiliary card 12 by sliding the auxiliary card 12 forward in the longitudinal direction 54 along the guide rails 22 thereby disengaging the connector socket 20 and the right angle connector 14. The faceplate 18 also provides a cover for any opening in an enclosure (not shown) holding the host card 10 and the auxiliary card 12, and may support visual indicators and other devices requiring routine access by the user.

Figure 4:
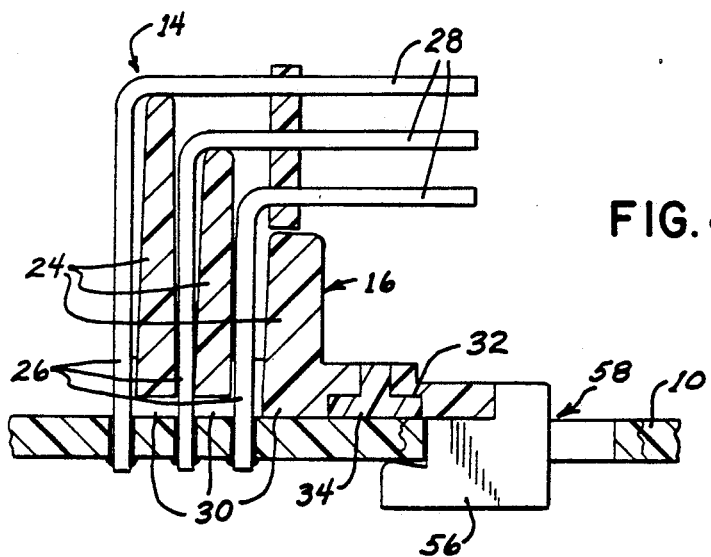
FIG. 4 is sectional view of the connector support and host card of the card guide taken along line 4—4 of FIG. 3.

Referring to FIGS. 2 and 4, the right angle connector 14 is comprised of a series of parallel vertical conductors 26 fitting, in a rectangular grid pattern, into the upper face of the host card 10 to provide electrical paths from the host card 10. The upper ends of these vertical conductors 26 are bent to form horizontal conductors 28 which maintain a similar grid spacing but in a plane perpendicular to the face of host card 10 and where each horizontal conductor 28 is directed longitudinally to receive the connector socket 20. Such connectors are generally available commercially under the name of header connector assemblies.

The vertical conductors 26 are separated from one another in the longitudinal direction 54 by support vanes 24 of the connector support 16. The support vanes 24 extend transversely between the rows of vertical conductors 26 to provide support against the longitudinal forces placed on the vertical conductors 26 by the engaging and disengaging of the connector socket 20 and the horizontal conductors 28.

The horizontal conductors 28 rest against the tops of the support vanes 24 to control the insertion depth of the vertical conductors 26 into the host card 10 during soldering of the vertical conductors 26 to the traces (not shown) of the host card 10. The forward most support vane also provides an insertion stop for the auxiliary circuit card 12.

The support vanes 24 are held by a support bases 30 at the transverse extremes of the connector support 16. The support bases 30 extends longitudinally between the support vanes 24 and orient the support vanes 24 to be perpendicular to the surface of the host card 10. Attached to each support bases 30 is a hook 56 which fits into a slot 58 cut in the surface of the host card 10. Rearward longitudinal motion of the connector support 16 engages the hook 56 around the edge of the slot 58 capturing the edge of the slot 58 between the upper surface of the hook 56 and the lower surface of the support base 30. The interfitting of the hook 56 surfaces with the slot 58 surfaces provides strong resistance to upward, transverse and rearward longitudinal motion of the connector support 16.

The dimension of the hook 56 is adjusted so that it applies a slight compressive force against the lower edge of the slot 58 thereby also resisting, to a lesser degree, forward longitudinal movement of the connector support 16 during the required soldering of the right angle connector 14. Referring to FIG. 4, when the right angle connector 14 is soldered to the host card 10, the connector support 16 may no longer be moved forward and hence the hooks 56 may no longer be disengaged from slots 58 and the connector support 6 is firmly locked in place.

Figure 5:
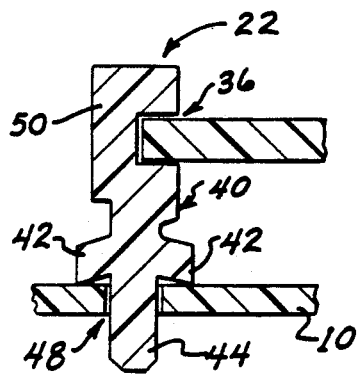
FIG. 5 is a sectional view of the guide rail of the card guide taken along line 5—5 of FIG. 2.
Figure 6:
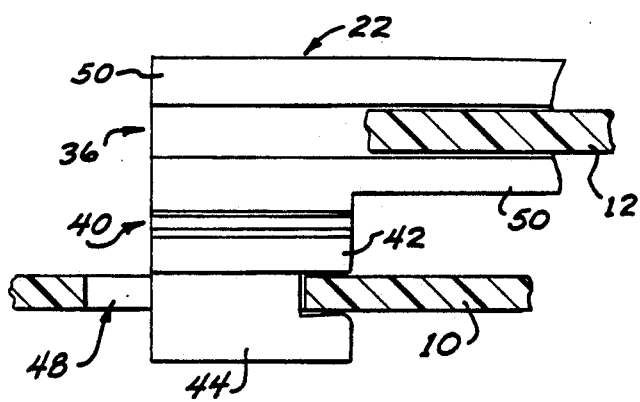
FIG. 6 is a sectional view of the guide rail perpendicular to that of FIG. 5 taken along line 6—6 of FIG. 2.

Referring to FIGS. 5 and 6, the guide rails 22 are comprised of a longitudinal rail 50 containing a channel 36 along its length to receive one transversely opposed edge of the auxiliary card 12. The two guide rails are mirror images of each other.

The rail 50 is supported by feet 40 extending vertically downward from the lower surface of the rail 50. Extending transversely on either side of the feet 40 are stabilizer wings 42 which fit against the upper surface of the host card 10 to resist transverse deflection of the feet 40 from vertical. Attached to the lowermost portion of each foot 40 is a hook 44, similar to that used in the connector support 16, which may be fit into a corresponding slot 48 (shown in FIG. 2) cut into the surface of the host card 10. Rearward longitudinal motion of the guide rails 22 engages the hooks 44 with the edges of the slots 48 capturing the edges of the slots 48 between the upper surface of the hooks 44 and the lower surface of the stabilizers 42. The interfitting of the hook surfaces with the slot surfaces provides strong resistance to upward and transverse and rearward motion of the guide rail 22.

Further resistance to longitudinal motion of the guide rail 22 is provided by the connector support 16. Referring to FIG. 3, the guide rail 22 is supported at its rear by rail base 46 which abuts the upper surface of the host card 10. Attached to the rail base 46 is an upward facing interlock tab 34 which may be received by corresponding downward facing interlock cavity 32 contained in the support base 30 of the connector support 16. The interlock tab 34 is held between the upper surface of the host card 10 and the lower surface of the interlock cavity 32. The connection of the interlock tabs 34 of each guide rail 22 and the interlock cavities 32 of corresponding ends of the connector support 16 serves to attach each guide rail 22 to one end of the connector support 16 and to position the guide rails 22 parallel to each other with the appropriate separation to allow the auxiliary card 12 to slide therebetween. This connection also aligns the connector support 16 with the connector socket 20 on the auxiliary card 12 when the auxiliary card 12 is in its rearmost position.

In practice, the card guide is assembled by first connecting the interlock tabs 34 of two guide rails 22 to the interlock cavities 32 of a connector support 16. The connected guide rails 22 and connector support 16 are aligned with the host card 10 such that the hooks 56 and 44 of the connecter support 16 and guide rails 22 fit within the slots 58 and 48 respectively.

The assembly of the guide rails 22 and the connector support 16 is moved longitudinally rearward to engage the hooks 54 and 44. The right angle connector 14 is then inserted into the connector support 16 and soldered to the host card 10.

As mentioned, the vertical conductors 26 of the right angle connector 14 prevent the connector support 16 from moving longitudinally forward. The hooks 56 also serve to prevent movement of the connector support 16 transversely or in a longitudinal rearward direction, and particularly near the interlock cavity 32, prevent movement of the support base 30 upward.

The guide rails 22 are fixed in position by their connection to the connector support 16 through the interlock tabs 34 and the interlock cavities 32. The interlock tabs 34 can not be disengaged from the interlock cavities 32 once the connector support 16 has been fixed against the host card 10. The hooks 44 of the legs 40 of the guide rails 22 are fixed in engagement to slots 48 because the interlocking tabs 34 and cavities 32 prevent longitudinal disengaging motion of the guide rails 22.

Figure 7:
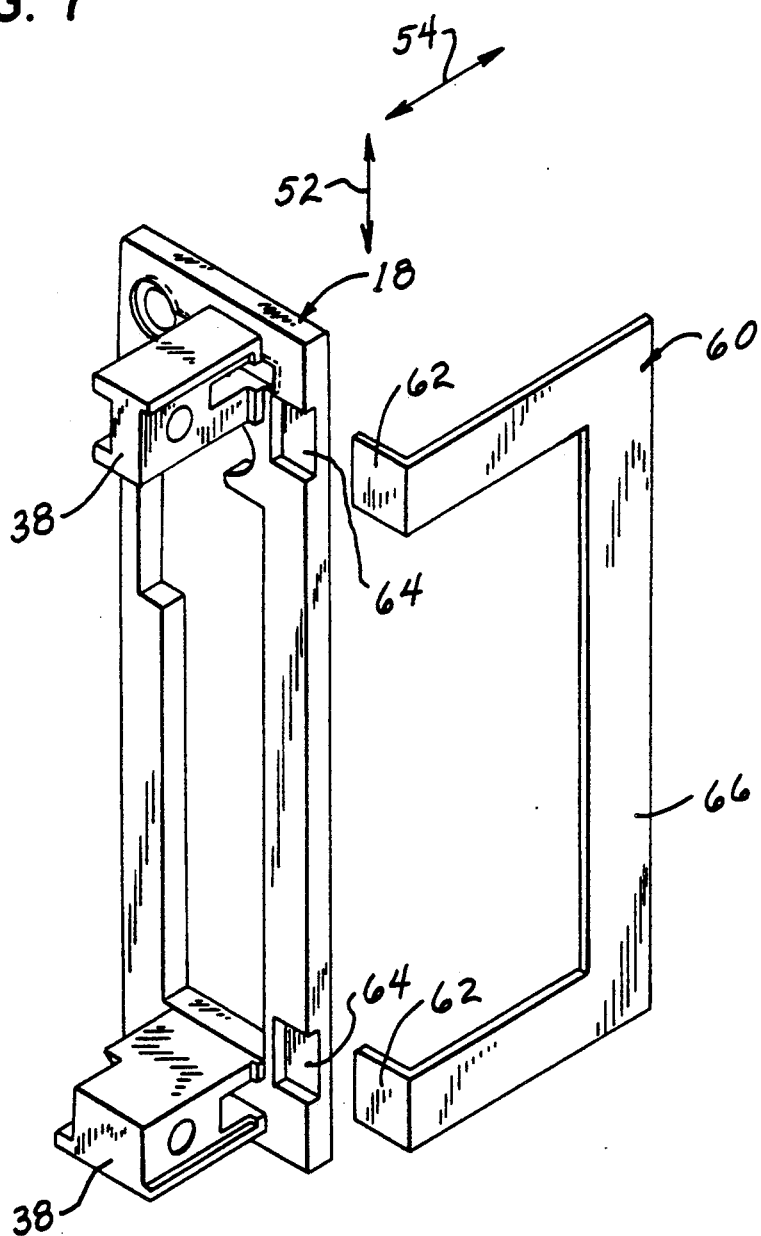
FIG. 7 is a persective view of a faceplate attached to the auxiliary card of FIG. 1 showing an extraction tool for removing same.

Referring to FIG. 7, removing the auxiliary card 12 from the card support may be accomplished by inserting the prongs 64 of an extraction tool 60 under the edge of the faceplate 18. The extraction tool 60 comprises a handle 66 extending so as to be pulled in the longitudinal direction. Attached at right angles to the handle 66 are two parallel rectangular prongs 62. The prongs 62 fit upwardly into recesses 64 along a transversely extending edge of the faceplate 18.

A longitudinal force on the handle 66 thus serves to pull the faceplate 18 in a longitudinal direction. The faceplate 18 is attached to the auxiliary card 12 by means of ears 38 extending toward the rear of the faceplate 18 and attached to the auxiliary card 12 by machine screws and nuts (not shown).

The recesses 64 allow the rear surface of faceplate 18 to abut the rim of aperture in an enclosure (also not shown) through which the auxiliary card 12 may be removed. Placement of the recesses 64 in the edge of faceplate 18 makes them unobtrusive, improving the aesthetic qualities of the faceplate 18 and discouraging tampering with or removal of the auxiliary card 12 by casual users of the equipment.

The connector support 16 and the guide rails 22 are positioned on the host card 10 prior to the attachment of the right angle connector 14 and hence must be able to resist the high temperatures of automated soldering processes. Accordingly, the connector support 16 and the guide rails 22 are injection molded of a high temperature plastic such as Vectra A-130, Celenese engineered resin, or other electrical grade plastic having an operating temperature of approximately 229° C.

The above description has been that of a preferred embodiment of the present invention. It will occur to those who practice the art that many modifications may be made without departing from the spirit and scope of the invention. In order to apprise the public of the various embodiments that may fall within the scope of the invention, the following claims are made.

I claim:

1. An auxiliary card system for holding a generally rectangular auxiliary printed circuit card parallel to a host circuit card, the host card including slots, comprising:
    guide means extending parallel to a first and second opposed edge of the auxiliary circuit card for slideably receiving the first and second edges of the auxiliary circuit card along an insertion axis and including hook means for attaching the guide means to the host circuit card the hook means for engaging the slots by extending through the slots and capturing the host circuit card between the upper surface of the hook means and a lower surface of the guide means when the guide means is moved along the insertion axis;
    connector means attached to and extending along a third edge of the auxiliary circuit card for electrically connecting the auxiliary circuit card to the host circuit card by means of conductors received by the host circuit card; and
    connector support extending parallel to the third edge of the auxiliary circuit card for receiving and supporting the connector means the connector support attached to the guide means to prevent relative motion along the insertion axis therebetween, and the connector support interfitting with the conductors to prevent motion of the conductor support along the insertion axis when the conductors are received by the host circuit board.

2. The auxiliary card support system recited in claim 1 wherein the hook means engage the slots when the connector support means is moved along the insertion axis in the direction the auxiliary circuit card is slideably received.

3. The auxiliary card support system recited in claim 2 wherein the connector support has second hook means for engaging the slots by extending through the slots and capturing the host circuit card between the upper surface of the second hook means and a lower surface of the connector support when the connector support means is moved along the insertion axis.

4. The auxiliary card support system recited in claim 2 wherein the connector support means is attached to the guide means by an interlocking tab for permitting the guide means to be removed from the connector support by relative motion therebetween other than along the insertion axis.

5. The auxiliary card support of claim 1 wherein the lower surface of the guide means includes stabilizer surfaces extending perpendicular to the insertion axis for flexing downward against the host circuit card when the hook means are engaged with the slots to prevent disengagement of the guide means from the edges of the auxiliary card.

6. An extraction system for an auxiliary circuit card said card being removable in a longitudinal forward direction, said extraction system comprising:
    a faceplate having outer dimensions conforming substantially to that of a rectangular prism and for attaching to one edge of the auxiliary card, the face plate having a back face with a flanking perpendicular face;
    an extraction tool having parallel prongs; and
    a first and second recess forming a cavity in the back face and presenting an opening at the flanking perpendicular edge along the back face sized for receiving the parallel prongs of the extraction tool but not for admitting a human finger.

* * * * *